United States Patent [19]
Torres et al.

[11] Patent Number: 5,960,262
[45] Date of Patent: Sep. 28, 1999

[54] STITCH BOND ENHANCEMENT FOR HARD-TO-BOND MATERIALS

[75] Inventors: Orlando F. Torres, Richardson; Edgardo R. Hortaleza, Garland, both of Tex.

[73] Assignee: Texas Instruments Incorporated, Dallas, Tex.

[21] Appl. No.: 09/158,845

[22] Filed: Sep. 23, 1998

Related U.S. Application Data

[60] Provisional application No. 60/060,098, Sep. 26, 1997.

[51] Int. Cl.$^6$ ............................ H01L 21/44; H01L 21/48; H01L 21/50
[52] U.S. Cl. .......................... 438/123; 438/121; 257/690; 228/180.5
[58] Field of Search ..................................... 438/106, 121, 438/123; 257/678, 690; 228/180.5

[56] References Cited

U.S. PATENT DOCUMENTS 5,328,079  7/1994  Mathew ............................... 228/180.5
5,735,030  4/1998  Orcutt ........................................ 29/86

*Primary Examiner*—Charles Bowers
*Assistant Examiner*—Nema Berezny
*Attorney, Agent, or Firm*—Wade James Brady III; Richard L. Donaldson

[57] ABSTRACT

A method of bonding a wire between a semiconductor die pad and a lead finger of a lead frame which includes providing a capillary having a bore and a wire pigtail extending through the bore and externally of the capillary. A ball is formed with the pigtail, a semiconductor die pad is provided and a ball bond is formed on the die pad with the ball. A lead frame finger is provided and the capillary and the wire threaded through the bore are moved to the lead frame finger. A stitch bond is formed on the lead finger with the capillary. The capillary is moved from the stitch bond with a pigtail of the wire extending out of the bore of the capillary. A second ball is formed with the pigtail and the capillary is again moved toward the stitch bond until the second ball contacts the stitch bond. A ball bond is then formed over and secured to the stitch bond and to the lead frame finger. The wire is preferably a gold alloy and the wire bond location includes a copper trace adhered to a flexible electrically insulating film.

23 Claims, 1 Drawing Sheet

STITCH BOND ENHANCEMENT FOR HARD-TO-BOND MATERIALS

This application claims priority under 35 USC 119(e)(1) of provisional application No. 60/060,098 filed Sep. 26, 1997.

BACKGROUND OF THE INVENTION

1. Field of the Invention

This invention relates to wire bonding and, more specifically to such bonding in the fabrication of semiconductor devices.

2. Brief Description of the Prior Art

In the fabrication of semiconductor devices, it is generally necessary to bond wires between locations of the semiconductor die as well as between the semiconductor die and the external environment. The wire bonding to the external environment generally involves the bonding of a wire between a bond pad on the semiconductor die and a lead finger on a lead frame. The lead frames are generally formed of copper or a copper alloy, such as A42 and the bond pads on the die are generally aluminum. Wire bonding is generally performed by first making a ball bond by placing a capillary over the bond pad with a ball of the wire extending out of the capillary and bonding the ball to the bond pad. The capillary is then moved to the lead finger of the lead frame to which a bond is to be made with the wire travelling with respect to the capillary bore and a stitch bond is made to the lead finger using the capillary with the wire then being broken, leaving a small wire pigtail extending out of the capillary. The wire, which is now bonded at both ends, is generally a gold alloy. The prior art metal lead frame has provided a stable surface for ultrasonic energy transfer to the bonding surface and the stitch bond has been highly reliable.

With the continued miniaturization of semiconductor devices, which has led to the advent of ball grid array (BGA) packages, FR4, BT and polyimide substrates have become the most popular material of choice for the lead frames. However, the lead frame materials and the lead finger portions of the lead frames do not offer the same rigidity as the metal lead frames. This has posed a problem in formation of the stitch bond because the ultrasonic energy which provides the heat required to form the stitch bond is not transferred efficiently to the bonding surface where the stitch bond is to be made. This causes the stitch bond to be unreliable and leads to diminished yields due to faulty bonding or even failure of the bond to take place.

SUMMARY OF THE INVENTION

In accordance with the present invention, the above noted problem inherent in the use of the lead frames which lack rigidity and/or are unable to transfer ultrasonic energy efficiently is overcome.

Briefly, the bonding process takes place the same as in the prior art with a ball bond being made to the die pad with the capillary and the capillary then moving to the lead finger and making the stitch bond. In a standard operation, the capillary is then lifted from the lead finger, at which time it is still positioned over the stitch bond. At this time, rather than moving to the next ball bond location, the pigtail extending out of the capillary is formed into a ball. This is accomplished in standard manner by the application to the pigtail of electronic flame off (EFO) which is a standard high voltage application of a spark to the pigtail end of the gold wire. The EFO melts the wire and forms the ball at the pigtail terminal portion and the capillary with the ball again descends so that the ball is positioned over and onto the stitch bond, thereby providing a ball bond over the stitch bond. The capillary is then moved in standard manner to the next bonding location. The combination of stitch bond followed by a ball bond thereover reduces the number of failures and thereby materially increases yields.

As can be seen, the prior art method is altered by merely requiring that the capillary make a repeat descent to the stitch bond or again move in the z-axis direction with the x-axis and y-axis locations remaining the same. No new process step is required. Only standard process steps which are part of the prior art fabrication process are required. The improvement to the stitch bond provided by the present invention is obtained by introducing the ball bond process onto the stitch bond which has both the high temperature on melted gold wire assisted by ultrasonic power to make the physical connection as opposed to the standard stitch bond process which relies only on ultrasonic power.

DESCRIPTION OF THE PREFERRED EMBODIMENT

Figure 1A:
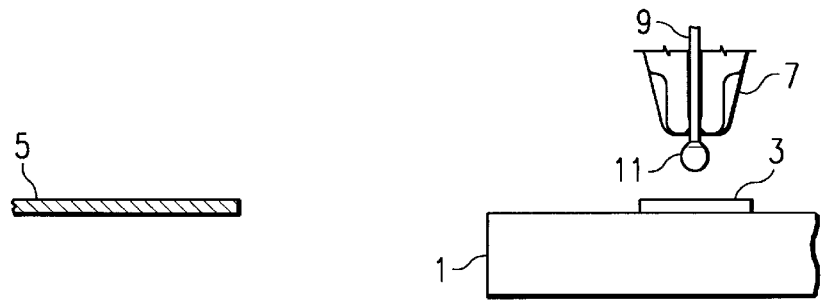
FIGS. 1a to 1f are a process flow for fabrication of a wire bond in accordance with the present invention.
Figure 1B:
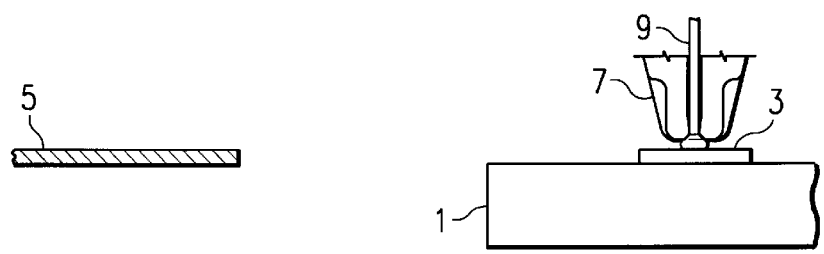
Figure 1C:
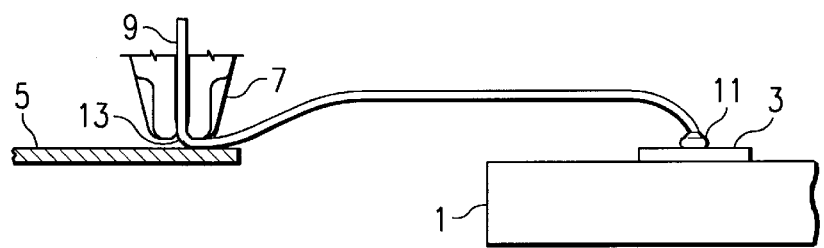
Figure 1D:
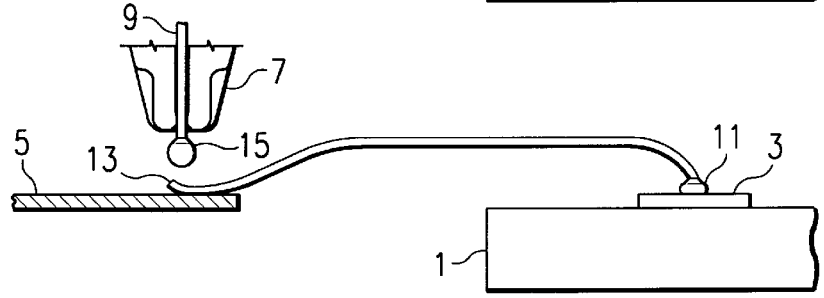
Figure 1E:
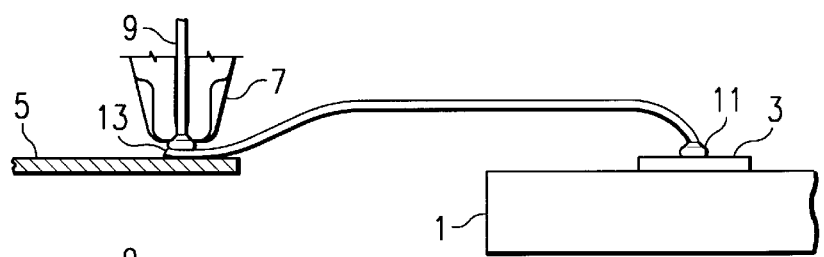
Figure 1F:
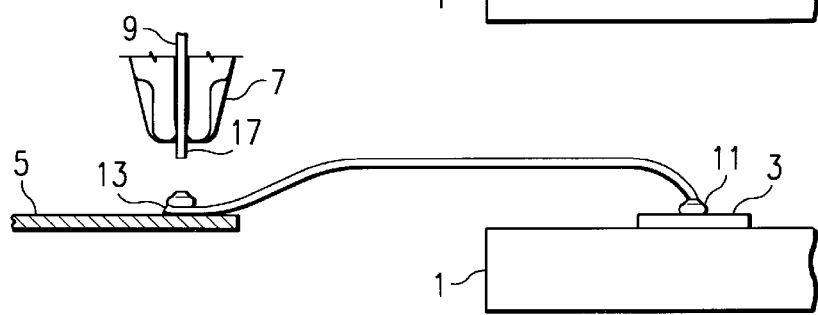

Referring to the FIGURES, there is shown in FIG. 1a a standard semiconductor die 1 having a bond pad 3 thereon and a lead finger 5 of a lead frame spaced from the die. The lead finger 5 can be, for example, a layer of polyimide film to which is secured a copper trace layer by means of an adhesive layer. A wire bond is to be made between the bond pad 3 and the lead finger 5. A standard capillary 7 has a wire 9 extending through the bore thereof with a pigtail portion of the wire extending out of the capillary bore and having formed a ball 11 in standard manner by the application of EFO energy to the pigtail portion of the wire by firing EFO. A ball bond is then made to the bond pad 3 by moving the capillary 7 until the ball 11 contacts the bond pad with the application of ultrasonic energy in standard manner as shown in FIG. 1b. A looping routine is then provided whereby the capillary 7 moves to the lead finger 5 with the wire 9 being threaded through the bore of the capillary and the capillary then making a stitch bond 13 with the wire on the lead finger with the application of ultrasonic energy in standard manner as shown in FIG. 1c. The capillary 7 is then lifted vertically from the stitch bond 13 so that it is positioned directly over the stitch bond with the pigtail of wire 9 extending out of the bore which being formed into another ball 15 in standard manner as shown in FIG. 1d. The capillary is then lowered so that the ball 15 contacts the stitch bond 13 with the ball extending around the stitch bond and contacting the lead finger 5 as well as being disposed over the stitch bond as shown in FIG. 1e. The capillary is then lifted away from the combined stitch bond 13/ball bond 15 with the wire 9 breaking immediately adjacent the bond in standard manner and leaving another pigtail 17 as shown in FIG. 1f. The capillary will then be moved to a new ball bonding location relative to a die with the pigtail 17 being formed into a ball in standard manner and the entire procedure is repeated.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

We claim:

1. A method of bonding a wire to a wire bonding location which comprises the steps of:
   (a) providing a wire bonding location;
   (b) forming a stitch bond on said wire bonding location of a lead frame finger; and
   (c) forming a ball bond over said stitch bond.

2. The method of claim 1 wherein said ball bond is also disposed in part on said wire bonding location.

3. The method of claim 1 further including the steps of providing a capillary having a bore and a wire extending through said bore and external of said capillary; moving said capillary to said wire bonding location to form said stitch bond with said wire external of said capillary; moving said capillary from said stitch bond after forming said stitch bond; forming a ball with wire extending from said bore and forming said ball bond with said ball.

4. The method of claim 2 further including the steps of providing a capillary having a bore and a wire extending through said bore and external of said capillary; moving said capillary to said wire bonding location to form said stitch bond with said wire external of said capillary; moving said capillary from said stitch bond after forming said stitch bond; forming a ball with wire extending from said bore and forming said ball bond with said ball.

5. The method of claim 4 wherein said step of forming said ball bond includes the step of moving said ball and capillary so that said ball contacts said stitch bond.

6. The method of claim 1 wherein said wire is a gold alloy.

7. The method of claim 2 wherein said wire is a gold alloy.

8. The method of claim 3 wherein said wire is a gold alloy.

9. The method of claim 4 wherein said wire is a gold alloy.

10. The method of claim 5 wherein said wire is a gold alloy.

11. The method of claim 1 wherein said wire bond location includes a copper trace adhered to a flexible electrically insulating film.

12. The method of claim 2 wherein said wire bond location includes a copper trace adhered to a flexible electrically insulating film.

13. The method of claim 3 wherein said wire bond location includes a copper trace adhered to a flexible electrically insulating film.

14. The method of claim 4 wherein said wire bond location includes a copper trace adhered to a flexible electrically insulating film.

15. The method of claim 5 wherein said wire bond location includes a copper trace adhered to a flexible electrically insulating film.

16. A method of bonding a wire between a semiconductor die pad and a lead finger of a lead frame which comprises the steps of:
   (a) providing a capillary having a bore and a wire pigtail extending through said bore and externally of said capillary;
   (b) forming a ball with said pigtail;
   (c) providing a semiconductor die pad;
   (d) forming a ball bond on said die pad with said ball;
   (e) providing a lead frame finger;
   (f) moving said capillary and said wire threaded through said bore to said lead frame finger;
   (g) forming a stitch bond on said lead frame finger with said capillary;
   (h) moving said capillary from said stitch bond with a pigtail of said wire extending out of said bore of said capillary;
   (i) forming a second ball with said pigtail;
   (j) moving said capillary toward said stitch bond until said second ball contacts said stitch bond; and
   (k) bonding said ball to said stitch bond.

17. The method of claim 16 wherein said step of bonding in step (k) also includes bonding said ball to said lead frame finger.

18. The method of claim 16 wherein said wire is a gold alloy.

19. The method of claim 17 wherein said wire is a gold alloy.

20. The method of claim 16 wherein said wire bond location includes a copper trace adhered to a flexible electrically insulating film.

21. The method of claim 17 wherein said wire bond location includes a copper trace adhered to a flexible electrically insulating film.

22. The method of claim 18 wherein said wire bond location includes a copper trace adhered to a flexible electrically insulating film.

23. The method of claim 19 wherein said wire bond location includes a copper trace adhered to a flexible electrically insulating film.

* * * * *